United States Patent [19]

Juengling

[11] Patent Number: 5,733,711
[45] Date of Patent: Mar. 31, 1998

[54] PROCESS FOR FORMING BOTH FIXED AND VARIABLE PATTERNS ON A SINGLE PHOTORESIST RESIN MASK

[75] Inventor: Werner Juengling, Boise, Id.

[73] Assignee: Micron Technology, Inc., Boise, Id.

[21] Appl. No.: 581,766

[22] Filed: Jan. 2, 1996

[51] Int. Cl.$^6$ .............................. G03F 9/00; G03F 7/36; G03F 9/30

[52] U.S. Cl. .............................. 430/312; 430/22; 430/945

[58] Field of Search .............................. 430/312, 22, 945, 430/394

[56] References Cited

U.S. PATENT DOCUMENTS 5,459,340  10/1995  Anderson et al. .............................. 257/203

OTHER PUBLICATIONS

T.D. Berker and S.E. Bernacki, "Dual-Polarity, Single-Resist Mixed (E-Beam/Photo)Lithography," IEEE Electron Device Letters, vol. EDL-2, No. 11, pp. 281-283, Nov. 1981.

*Primary Examiner*—George F. Lesmes
*Assistant Examiner*—Cheryl Juska
*Attorney, Agent, or Firm*—Fillmore, Belliston & Israelsen; Angus C. Fox, III

[57] ABSTRACT

This invention is embodied in several variations of a process for independently forming both fixed and variable patterns within a single photoresist resin layer. In one application of the invention, both a fixed global alignment mark pattern and a variable identification mark pattern are formed in a single photoresist resin layer, and both patterns are transferred to an underlying substrate with a single etch step. Each pattern is formed independently of the other; the global alignment mark pattern by exposing the photoresist resin on a stepper device, and the identification mark pattern by either exposing or ablating the photoresist resin with a computer-controlled laser beam. Although this invention is described in the context of placing marks on a semiconductor wafer, the method is also applicable to other types of marks on other types of substrates.

10 Claims, 4 Drawing Sheets

PROCESS FOR FORMING BOTH FIXED AND VARIABLE PATTERNS ON A SINGLE PHOTORESIST RESIN MASK

BACKGROUND OF THE INVENTION

1. Field of the Invention

This invention relates to masking processes used for the fabrication of integrated circuits, to the formation of alignment and identification marks on semiconductor wafers, and to the reduction of particle pollution in the manufacture of integrated circuits.

2. Description of Related Art

Integrated circuit devices are typically fabricated in mass on silicon wafers. During the fabrication process, a semiconductor wafer is transformed into a multitude of integrated circuits by subjecting it to numerous ordered steps, which may include coating with photoresist resin, exposure of the photoresist resin to electromagnetic radiation using a reticle affixed to a precision stepper device, development of the photoresist resin to form a mask, oxidation, nitridization, silicidation, wet etching, plasma etching, chemical vapor deposition, plasma-enhanced chemical vapor deposition, sputter deposition, ion implants, annealing steps for activating and driving implanted ions. Contemporary 16-megabit dynamic random access memories typically require 15 to 20 masking steps during the fabrication process. Once the processing of a wafer substrate has begun, subsequent masks must be precisely aligned so that resulting structures are accurately fabricated for optimum performance. Two types of alignment techniques are prevalent today. The first, global alignment, generally employs two precisely-located global alignment marks which are etched on opposite sides of a wafer. FIG. 1 is a graphic representation of one such alignment mark. An X-Y laser-optical positioning system aligns the stepper device to those two marks. Each die location on the wafer relative to the two global alignment marks is sequentially found by the stepper and exposed. The second technique, individual die alignment, utilizes recognizable features on a single die to individually align that die to the stepper.

A certain amount of mask misalignment is inherent to any alignment system. For example, using 0.5 μm photolithography, 0.1 to 0.15 μm (equivalent to 20 to 30 percent of the minimum feature size) is generally specified to be the maximum tolerable misalignment for a global alignment system. For an individual die alignment system, misalignment values can typically be halved. Despite the better alignment accuracy of individual die alignment, it is seldom used because it greatly increases manufacturing costs.

Wafers processed in both developmental and production fabrication facilities must be uniquely identifiable so that they may be tracked during the sequence of processing steps. Usually, each wafer receives a human-readable lot number and a machine-readable bar code. Both the lot number and the bar code are laser scribed on the edge of the wafer. Laser scribing is performed by a high-energy laser beam which vaporizes the silicon on the wafer to create patterns of dots for both the lot number and the bar code. FIG. 2 is a graphic representation of a typical dot pattern used to represent the digits "0" and "8". The identifying marks are generally placed on the wafer before the commencement of the fabrication steps. The laser scribing process is desirable for at least two reasons. Firstly, the process is flexible, in that identifying marks are readily changed from wafer to wafer. Secondly, the process has a short turn-around time. The laser scribing process does, however, have one serious drawback. Each of the more than 200 dots, which together form the image of each number, is a pit formed by vaporizing a portion of the surface material of the wafer 21. Pit formation generates a large number of particles which will compromise yield if not completely removed. FIG. 3 is a graphic representation of a highly-magnified dot pattern that is typical of the laser scribing process. Each dot 31 on the surface of wafer 21, is a pit having sloped walls 32 and a floor 33. The wafer material ejected from pits as it both melts and vaporizes, is often seen as splatter particles 34. Although each wafer receives a thorough cleaning and rinsing, it is nearly impossible to remove every single particle.

Global alignment marks, often referred to as "combi" marks, are etched into the wafer following the laser scribing process. Generally, this is accomplished by growing an oxide layer having a thickness of about 200 Å on the upper surface of the wafer. Photoresist resin is then spun onto the upper surface. A stepper, using the flat of the wafer as a basic reference, exposes the photoresist resin to create a mark pattern at a first location on the wafer and then subsequently exposes the resin at another location to create a second mark pattern at a precise distance from the first location. It should be noted that the accurate placement and alignment of each alignment mark pattern relative to the other is more critical than accurate placement of either alignment mark pattern relative to the wafer flat. Following development of the photoresist to create a visible alignment mark pattern at both locations on the wafer, the wafer is subjected to a primarily anisotropic plasma etch which transfers the pattern to the underlying silicon substrate to a depth of about 1,200 Å. The aforedescribed process for forming global alignment marks is very clean and generates few, if any, particles.

A primary object of this invention is the provision of a particle-free process for generating not only the global alignment marks, but the identification marks on the edge of a wafer as well.

SUMMARY OF THE INVENTION

This invention is embodied in several variations of a process for independently forming both fixed and variable patterns within a single photoresist resin layer. In one application of the invention, both a fixed global alignment mark pattern and a variable visual identification mark pattern are formed in a single photoresist resin layer, and both patterns are transferred to an underlying substrate with a single etch step. Each pattern is formed independently of the other; the global alignment mark pattern by exposing the photoresist resin on a stepper device, and the identification mark pattern by either exposing or ablating the photoresist resin with a computer-controlled laser beam. Although this invention is described in the context of placing marks on a semiconductor wafer, the method is also applicable to other types of marks on other types of substrates. In the case of a semiconductor wafer, the global alignment marks are formed conventionally as described in the section of this application entitled "Description of Related Art" by forming an oxide layer on the upper surface of a semiconductor wafer, coating the oxide layer with a photoresist resin layer, exposing the photoresist resin layer to a pair of global alignment mark patterns on a stepper exposure apparatus which uses the flat of the wafer as a baseline reference, developing the photoresist resin layer to form an etch mask with both alignment mark patterns, and transferring the alignment mark patterns to the underlying oxide layer with a primarily anisotropic etch. However, before the alignment mark patterns are transferred to the oxide layer with the etch step, an identification mark pattern is formed in the photoresist resin layer at the edge of the wafer using a computer-controlled laser beam. In a first embodiment of the process, a laser beam which generates a frequency of light within the range required for photoresist resin exposure is employed to expose an identification mark pattern on the edge of the wafer before the photoresist resin is developed. After exposure to the laser-generated pattern, the photoresist resin is developed and both the alignment mark pattern and the identification pattern are subsequently transferred to the underlying substrate with a single etch step. In a second embodiment of the process, the identification mark pattern is formed by a laser beam having sufficient power to ablate (i.e., vaporize) the resist resin, but insufficient power to vaporize or melt the underlying silicon dioxide and silicon substrate.

DETAILED DESCRIPTION OF THE INVENTION

This invention embodies a process for forming both fixed and variable patterns on a single photoresist resin layer. Although this invention is described in the context of placing both global alignment marks and identification marks on a semiconductor wafer, the method is also applicable to other types of marks on other types of substrates. The global alignment mark pattern and the wafer identification mark pattern are formed independently of one another in a single photoresist resin layer, and both patterns are transferred to an underlying layer with a single etch step. The global alignment marks are formed on the surface of the wafer in a conventional manner as described in the Background of the Invention section by forming a silicon dioxide layer on the upper surface of a silicon substrate, coating the silicon dioxide layer with a photoresist resin layer, exposing the photoresist resin layer to a pair of global alignment mark patterns on a stepper exposure apparatus which uses the flat of the wafer as a baseline reference, developing the photoresist resin layer to form an etch mask containing the global alignment mark patterns, and transferring the global alignment mark patterns present in the etch mask to the underlying silicon dioxide layer with a primarily anisotropic etch. The identification mark pattern is formed by interrupting the conventional global alignment mark formation process flow. The distinguishing feature of the new process is that the identification mark pattern is formed in the photoresist resin layer using a computer-controlled laser beam.

Figure 1:
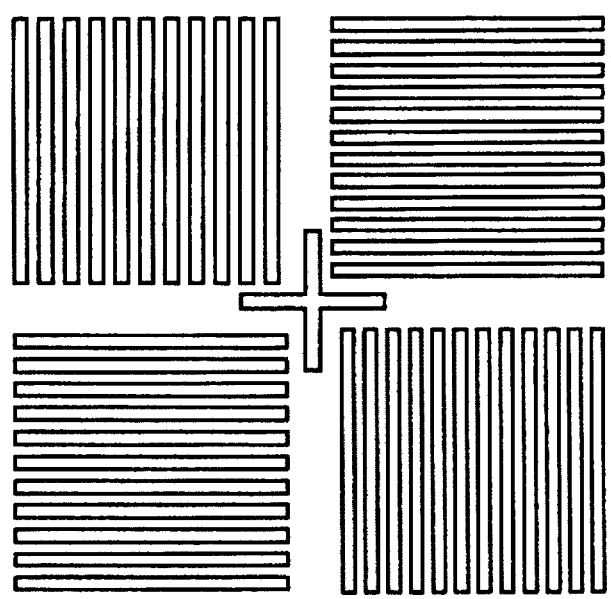
FIG. 1 is a graphic representation of a global alignment mark pattern.
Figure 2:
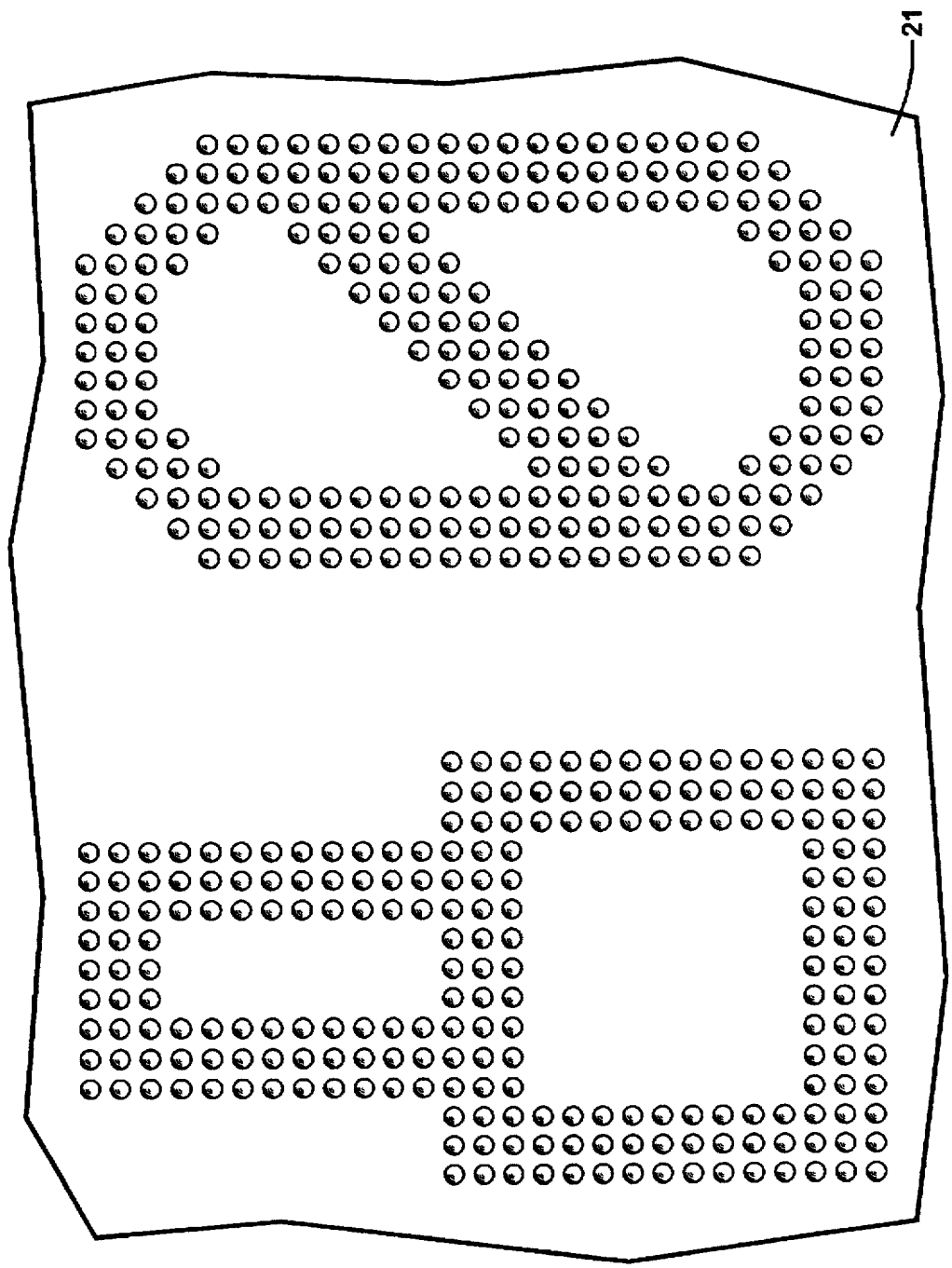
FIG. 2 is a trace of a digitized image of the digit pair "0" and "8" formed by a laser scribing process.
Figure 3:
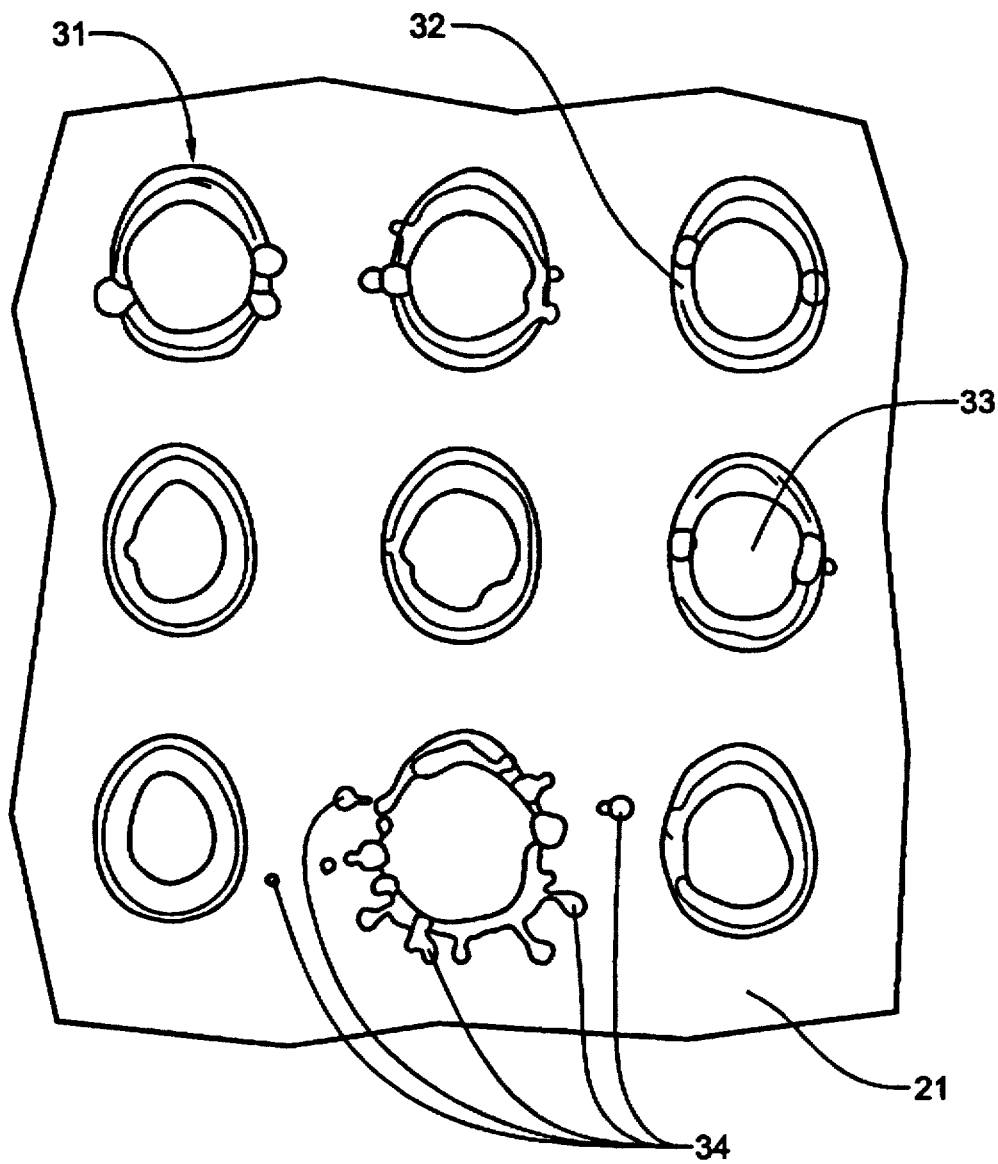
FIG. 3 is trace of a digitized image of a highly-magnified dot pattern that is typical of the laser scribing process.
Figure 4:
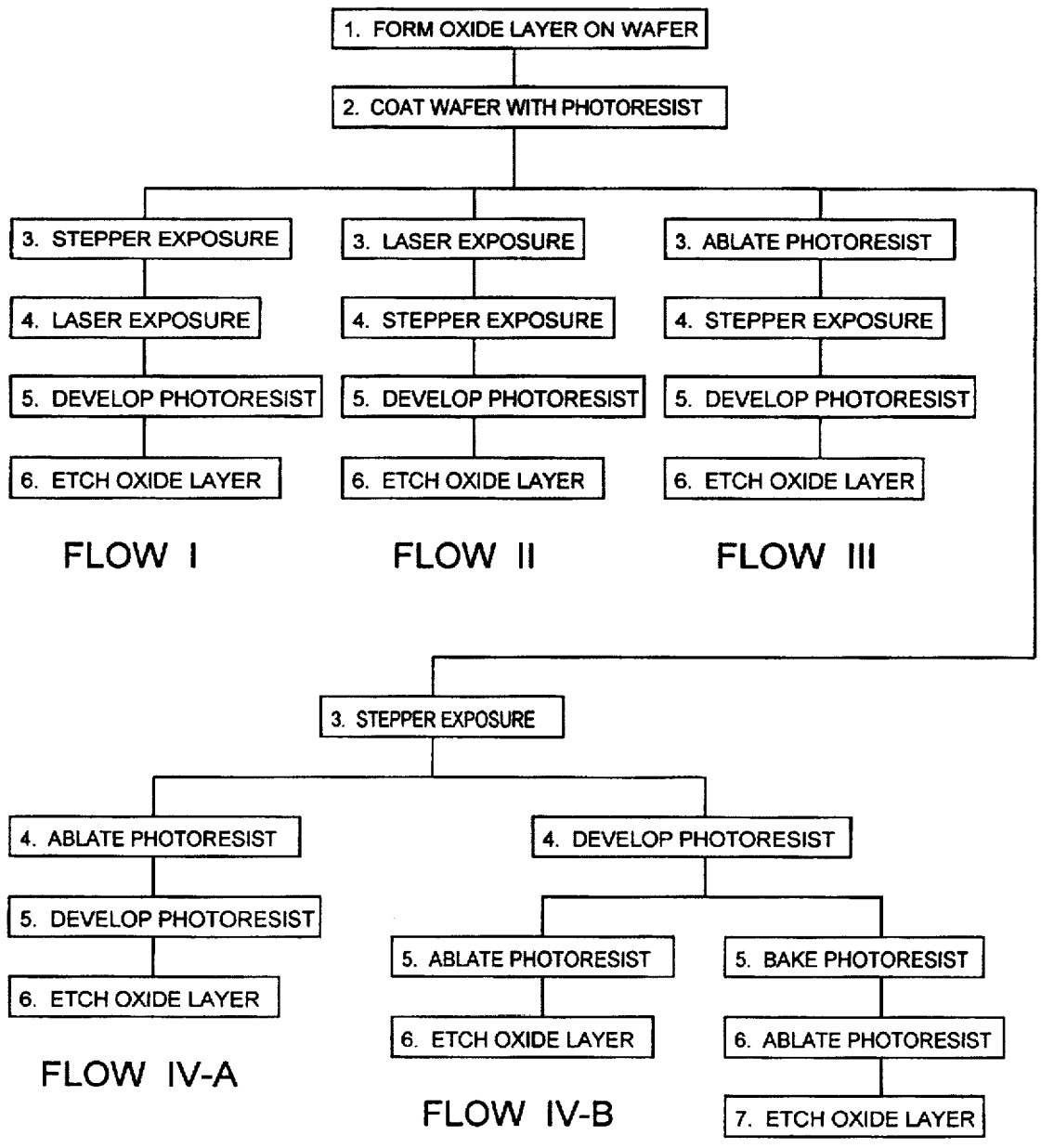
FIG. 4 is a flow chart which depicts the several embodiments of the process for forming both fixed and variable patterns on a single photoresist resin mask.

The flow chart of FIG. 4 depicts the unique process flows which characterize the various embodiments of the invention. There are four basic process flows: Flow I, Flow II, Flow III and Flow IV. For process flows I and II, the identification mark pattern is formed by exposing undeveloped photoresist to a computer-controlled laser beam which generates a frequency of light within the range required for photoresist resin exposure. Process flows I and II are best suited for producing engraved symbols when used in conjunction with positive photoresist (which is characterized by removal of exposed portions during development). Their use with negative photoresist will produce a relief pattern (i.e., a pattern that is raised above a flat surface). For process flows III and IV, the identification mark pattern is formed by a laser beam having sufficient power to ablate (i.e., vaporize) the resist resin, but insufficient power to vaporize or melt the underlying silicon dioxide and silicon substrate. Referring now to FIG. 4, it will be seen that all four basic process flows begin by forming an oxide layer on a semiconductor wafer. The oxide layer may be formed by thermally oxidizing the surface of the wafer or by depositing a silicon dioxide layer on the surface of the wafer. A photoresist resin layer is then applied to the surface of the wafer. After the application of the photoresist resin layer, the process flows diverge.

Still referring to FIG. 4, Process Flow I continues by exposing the undeveloped photoresist layer using a stepper device to a reticle having the global alignment mark pattern thereon. The undeveloped photoresist resin layer is subsequently exposed to the computer-controlled laser beam which writes the unique wafer identification mark pattern. The wafer identification mark pattern is typically placed at the edge of the wafer. The photoresist resin layer is then developed to form an etch mask having both the alignment mark pattern and the identification mark pattern. An etch step then transfers both patterns to the underlying silicon dioxide layer.

Still referring to FIG. 4, Process Flow II is similar and should be considered equivalent to Process Flow I. The only difference is that the exposure steps are reversed.

Still referring to FIG. 4, Process Flow III continues by ablating a portion of the undeveloped photoresist resin layer with a computer-controlled laser beam to form the identification mark pattern. Subsequent development of the photoresist resin layer reveals the alignment mark pattern (the identification mark pattern is already fully formed). A subsequent etch step is employed to transfer both patterns to the underlying silicon dioxide layer.

Still referring to FIG. 4, Process Flow IV is distinguished from Process Flow III by exposure of the undeveloped photoresist resin to the alignment mark pattern on the stepper prior to the formation of the identification mark pattern through ablation. Process Flow is actually made up of three subflows, IV-A, IV-B, and IV-C. In Subflow IV-A, the laser ablation step (which forms the identification mark pattern) is performed on the undeveloped photoresist resin layer. Subsequent development of the photoresist resin layer reveals the alignment mark pattern. A subsequent etch step transfers both patterns to the underlying silicon dioxide layer. In Subflows IV-B and IV-C, the ablation step is performed subsequent to development of the photoresist resin layer. Subflow IV-C differs from Subflow IV-B in that the developed photoresist resin layer having the alignment mark pattern is baked prior to the laser ablation step so that the heat generated during the laser ablation step does not cause the photoresist resin at the ablation sites to sag or melt and recover the ablated regions.

For Process Flow III, baking the photoresist resin prior to the laser ablation step is ill-advised, as it will interfere with the exposure and development of the alignment mark pattern.

Although only several embodiments of the new process for forming both fixed and variable patterns on a single photoresist resin mask are disclosed herein, it will be obvious to those having ordinary skill in the art, that changes and modifications may be made thereto without departing from the scope and the spirit of the invention as hereinafter claimed.

I claim:

1. A process for forming on an etchable surface of each of a plurality of workpieces both a first pattern common to all workpieces and a second pattern which varies from workpiece to workpiece, said process comprising the steps of:

coating the etchable surface on each workpiece with a photoresist layer;

forming said first pattern in said photoresist layer by exposing a first set of regions of said photoresist layer to electromagnetic radiation through a mask reticle, said first pattern revealable by developing said photoresist layer;

forming said second pattern in said photoresist layer by ablating a second set of regions of said photoresist layer with a computer-controlled laser beam; and transferring said first and second patterns from the photoresist layer to the etchable surface with an etch step.

2. The process of claim 1 wherein said laser beam has insufficient energy to melt or vaporize said etchable surface.

3. The process of claim 1 wherein each workpiece is a semiconductor wafer, and said mask reticle is mounted on a stepper device.

4. A process for forming on an etchable surface of each of a plurality of semiconductor wafers both an alignment mark pattern common to all wafers and an identification pattern unique to each wafer, said process comprising the steps of:

coating the etchable surface of each wafer with a photoresist layer;

forming said alignment mark pattern in said photoresist layer by exposing a first set of regions of the photoresist layer to electromagnetic radiation through a mask reticle mounted on a stepper device, said alignment mark revealable by developing said photoresist layer;

forming said identification pattern in said photoresist layer by ablating a second set of regions of said photoresist layer with a computer-controlled laser beam; and transferring said first and second patterns from the photoresist layer to the etchable surface with an etch step.

5. The process of claim 4, wherein said computer-controlled laser beam has insufficient energy to melt or vaporize said etchable surface.

6. The process of claim 4 wherein said etch step is a predominantly anisotropic plasma etch.

7. The process of claim 4, which further comprises the step of baking the photoresist layer prior to forming said identification pattern.

8. The process of claim 4, wherein the act of forming said alignment mark pattern occurs prior to the act of forming said identification pattern.

9. The process of claim 4, wherein the act of forming said alignment mark pattern occurs subsequent to the act of forming said identification pattern.

10. The process of claim 4, wherein a silicon dioxide layer forms the etchable surface on each wafer.

* * * * *